United States Patent
Wakaki

(10) Patent No.: US 11,127,686 B2
(45) Date of Patent: Sep. 21, 2021

(54) RADIO-FREQUENCY MODULE AND COMMUNICATION DEVICE

(71) Applicant: Murata Manufacturing Co., Ltd., Kyoto (JP)

(72) Inventor: Ken Wakaki, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/832,756

(22) Filed: Mar. 27, 2020

(65) Prior Publication Data

US 2020/0258840 A1 Aug. 13, 2020

Related U.S. Application Data

(63) Continuation of application No. PCT/JP2018/035554, filed on Sep. 26, 2018.

(30) Foreign Application Priority Data

Sep. 29, 2017 (JP) .............................. JP2017-190130

(51) Int. Cl.
*H01L 23/538* (2006.01)
*H03F 1/56* (2006.01)
(Continued)

(52) U.S. Cl.
CPC ...... *H01L 23/5383* (2013.01); *H01L 23/3121* (2013.01); *H01L 23/49811* (2013.01);
(Continued)

(58) Field of Classification Search
CPC ............. H01L 23/5383; H01L 23/3121; H01L 23/49811; H01L 23/5386; H01L 23/66;
(Continued)

(56) References Cited

U.S. PATENT DOCUMENTS

2004/0032706 A1 2/2004 Kemmochi et al.
2004/0043732 A1 3/2004 Hikita et al.
(Continued)

FOREIGN PATENT DOCUMENTS

JP 2000223656 A 8/2000
JP 2011014910 A 1/2011
(Continued)

OTHER PUBLICATIONS

International Search Report issued in Application No. PCT/JP2018/035554, dated Dec. 4, 2018.
(Continued)

*Primary Examiner* — Lee Nguyen
(74) *Attorney, Agent, or Firm* — Pearne & Gordon LLP

(57) ABSTRACT

A radio-frequency module (10) includes an IC chip (20) and a mounted component (41, 42, 43) mounted on the IC chip (20). The IC chip (20) includes a core substrate (21) composed of a semiconductor having a first main surface (211) and a second main surface (212) opposed to each other, and a metal wiring layer (22) formed on the first main surface (211) of the core substrate (21) and having a contact surface in contact with the first main surface (211) and a third main surface (221) opposed to the contact surface. The mounted component (41, 42, 43) is mounted at the third main surface (221) side.

19 Claims, 3 Drawing Sheets

(51) Int. Cl.
*H01L 23/31* (2006.01)
*H01L 23/498* (2006.01)
*H01L 23/66* (2006.01)
*H01L 25/065* (2006.01)
*H01L 25/16* (2006.01)
*H03F 3/213* (2006.01)
*H04B 1/40* (2015.01)
*H01L 23/00* (2006.01)

(52) U.S. Cl.
CPC .......... *H01L 23/5386* (2013.01); *H01L 23/66* (2013.01); *H01L 25/0655* (2013.01); *H01L 25/16* (2013.01); *H03F 1/56* (2013.01); *H03F 3/213* (2013.01); *H04B 1/40* (2013.01); *H01L 24/16* (2013.01); *H01L 2223/6655* (2013.01); *H01L 2224/16227* (2013.01); *H01L 2924/30111* (2013.01); *H03F 2200/294* (2013.01); *H03F 2200/387* (2013.01); *H03F 2200/451* (2013.01)

(58) Field of Classification Search
CPC ................. H01L 25/0655; H01L 25/16; H01L 2924/294; H01L 24/16; H01L 2223/6655; H01L 2924/30111; H01L 2224/16227; H03F 1/56; H03F 3/213; H03F 2200/387; H03F 2200/451; H03F 2200/294; H04B 1/40

USPC .................................................. 257/750, 774
See application file for complete search history.

(56) References Cited

U.S. PATENT DOCUMENTS

| 2011/0001249 | A1  | 1/2011  | Law et al. |
| 2013/0122833 | A1  | 5/2013  | Hadjichristos et al. |
| 2014/0209926 | A1  | 7/2014  | Takatani et al. |
| 2017/0053897 | A1  | 2/2017  | Lai et al. |
| 2019/0355667 | A1* | 11/2019 | Kwon .................... H01L 24/48 |

FOREIGN PATENT DOCUMENTS

| JP | 2011254505 A | 12/2011 |
| JP | 2014146780 A | 8/2014 |
| JP | 2014533911 A | 12/2014 |

OTHER PUBLICATIONS

Written Opinion issued in Application No. PCT/JP2018/035554, dated Dec. 4, 2018.

* cited by examiner

RADIO-FREQUENCY MODULE AND COMMUNICATION DEVICE

This is a continuation of International Application No. PCT/JP2018/035554 filed on Sep. 26, 2018 which claims priority from Japanese Patent Application No. 2017-190130 filed on Sep. 29, 2017. The contents of these applications are incorporated herein by reference in their entireties.

BACKGROUND OF THE DISCLOSURE

Field of the Disclosure

The present disclosure relates to a radio-frequency module including a plurality of circuit elements.

Description of the Related Art

Hitherto, various radio-frequency modules have been put into practical use. For example, a radio-frequency module described in Patent Document 1 includes a multilayer substrate and a plurality of mounted components.

Electrode patterns are formed in the multilayer substrate, and circuit elements are realized by the electrode patterns. The plurality of mounted components are mounted on the surface of the multilayer substrate.

Patent Document 1: Japanese Unexamined Patent Application Publication No. 2011-254505

BRIEF SUMMARY OF THE DISCLOSURE

In recent years, a further reduction in height is required for radio-frequency modules. However, a reduction in height is limited with the conventional configuration as shown in Patent Document 1.

Therefore, an object of the present disclosure is to provide a radio-frequency module capable of reducing a height thereof as compared to that in the related art.

A radio-frequency module according to the disclosure includes an IC (integrated circuit) chip and a mounted component mounted on the IC chip. The IC chip includes a core substrate composed of a semiconductor having a first main surface and a second main surface opposed to each other, and a metal wiring layer formed on the first main surface of the core substrate and having a contact surface in contact with the first main surface and a third main surface opposed to the contact surface. The mounted component is mounted at a side of the third main surface.

With this configuration, the mounted component is mounted with the IC chip as a base substrate. Accordingly, it is not necessary to mount the IC chip and the mounted component on another base substrate formed from a resin or the like. Therefore, the height of the radio-frequency module is reduced by the other base substrate.

In the radio-frequency module according to the disclosure, a rewiring layer may be formed on the third main surface, and the metal wiring layer and the mounted component may be connected to each other via the rewiring layer.

With this configuration, the flexibility in an arrangement pattern of mounting type circuit elements is improved.

A radio-frequency module according to the disclosure includes an IC chip and a mounted component mounted on the IC chip. The IC chip includes a core substrate composed of a semiconductor substrate having a first main surface and a second main surface opposed to each other, and a metal wiring layer formed on the first main surface of the core substrate and having a contact surface in contact with the first main surface and a third main surface opposed to the contact surface. The mounted component is mounted on the second main surface.

With this configuration, the mounted component is mounted with the IC chip as a base substrate. Accordingly, it is not necessary to mount the IC chip and the mounted component on another base substrate formed from a resin or the like. Therefore, the height of the radio-frequency module is reduced by the other base substrate.

The radio-frequency module according to the disclosure may include a circuit element within the IC chip. The mounted component is connected to the circuit element via the metal wiring layer.

With this configuration, it is possible to reduce the size of the radio-frequency module, and it is further possible to inhibit transmission loss, parasitic inductance, and parasitic capacitance.

In the radio-frequency module according to the disclosure, a region where the mounted component is arranged and a region where the circuit element is arranged preferably overlap each other in a plan view.

With this configuration, it is possible to decrease the planar area of the radio-frequency module.

The core substrate of the radio-frequency module according to the disclosure preferably includes an external connection electrode on the second main surface. The mounted component and the circuit element are connected to the external connection electrode by a via electrode formed in the IC chip.

With this configuration, the flexibility in arrangement of the external connection electrode in the radio-frequency module is improved.

The radio-frequency module according to the disclosure preferably includes a plurality of IC chips including the IC chip and a plurality of mounted components including the mounted components. The plurality of IC chips are arranged adjacent to each other in a plan view, and the plurality of mounted components are each mounted on any of the plurality of IC chips.

With this configuration, the plurality of mounted components are each mounted with any of the IC chips as a base substrate. Accordingly, it is not necessary to mount the plurality of IC chips including the circuit elements therein and the plurality of mounted components on another base substrate formed from a resin or the like. Therefore, the height of the radio-frequency module is reduced by the other base substrate.

The radio-frequency module according to the disclosure preferably includes a mold resin covering surface sides of the plurality of IC chips where the mounted components are mounted and joining the plurality of IC chips.

With this configuration, a radio-frequency module in which a plurality of IC chips and a plurality of mounted components are integrated with each other is realized.

The radio-frequency module according to the disclosure may have the following configuration. The circuit element is a power amplifier. The mounted component is a matching element connected to the power amplifier.

With this configuration, a radio-frequency module that has a low height and in which the heat dissipation of a power amplifier is increased and impedance matching between the power amplifier and an external circuit is realized, is realized.

In the radio-frequency module according to the disclosure, the circuit element may be a low noise amplifier.

With this configuration, it is possible to reduce the size of the radio-frequency module.

In the radio-frequency module according to the disclosure, the circuit element may be a switch element.

With this configuration, it is possible to reduce the size of the radio-frequency module.

The communication device may include any radio-frequency module described above and an RFIC (radio-frequency integrated circuit) connected to the radio-frequency module, and the circuit element may be the RFIC.

With this configuration, a reduction in transmission loss as a communication device and a reduction in size are realized.

The radio-frequency module according to the disclosure may include a BBIC (baseband integrated circuit) connected to the RFIC, and the circuit element may be the BBIC.

With this configuration, a reduction in transmission loss as a communication device and a reduction in size are realized.

According to the present disclosure, it is possible to realize a radio-frequency module having a low height.

DETAILED DESCRIPTION OF THE DISCLOSURE

Figure 1:
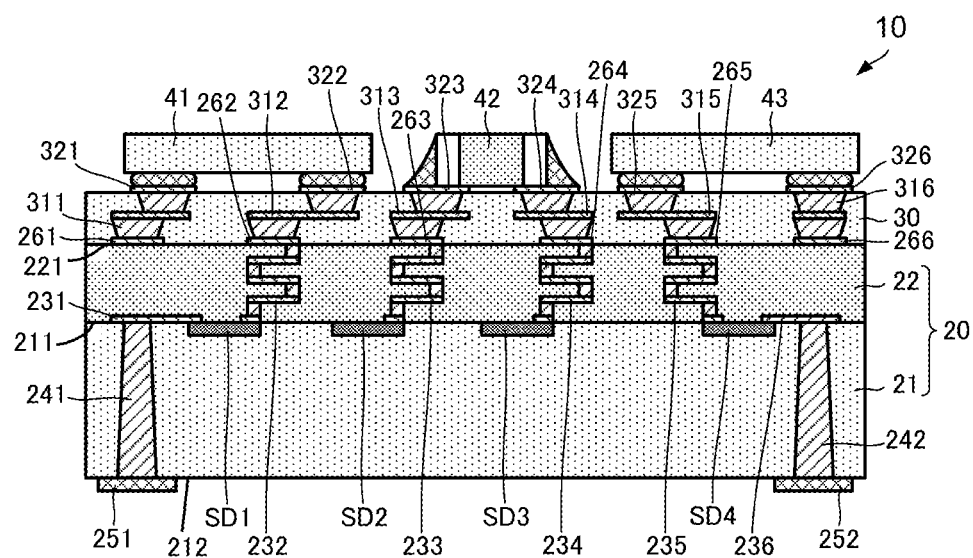
FIG. 1 is a side cross-sectional view showing the configuration of a radio-frequency module 10 according to a first embodiment of the present disclosure.

A radio-frequency module according to a first embodiment of the present disclosure will be described with reference to the drawing. FIG. 1 is a side cross-sectional view showing the configuration of a radio-frequency module 10 according to the first embodiment of the present disclosure. In FIG. 1, the relationship between the vertical and horizontal dimensions is emphasized as appropriate, and does not necessarily coincide with the relationship between the actual vertical and horizontal dimensions. In FIG. 1, some electrodes are not shown.

As shown in FIG. 1, the radio-frequency module 10 includes an IC chip 20, a rewiring layer 30, and mounted components 41, 42, and 43.

The IC chip 20 includes a core substrate 21 and a metal wiring layer 22.

The core substrate 21 is a flat plate and has a first main surface 211 and a second main surface 212. The first main surface 211 and the second main surface 212 are opposed to each other at a distance and are orthogonal to the thickness direction of the core substrate 21. The core substrate 21 is a semiconductor substrate.

A plurality of circuit elements SD1, SD2, SD3, and SD4 are formed at the first main surface 211 side of the core substrate 21. The plurality of circuit elements SD1, SD2, SD3, and SD4 are realized, for example, by doping with impurities in a predetermined plane pattern at a predetermined depth from the first main surface 211 of the core substrate 21. The plurality of circuit elements SD1, SD2, SD3, and SD4 are, for example, FETs or transistors used as amplification elements for radio-frequency signals, FETs used as switch elements, diodes used as ESD protection elements, or the like.

A plurality of via electrodes 241 and 242 are formed in the core substrate 21 so as to penetrate from the first main surface 211 to the second main surface 212. A plurality of external connection electrodes 251 and 252 are formed on the second main surface 212 of the core substrate 21. The external connection electrode 251 is connected to the via electrode 241. More specifically, in a plan view of the core substrate 21, the external connection electrode 251 overlaps the via electrode 241. The external connection electrode 252 is connected to the via electrode 242. More specifically, in a plan view of the core substrate 21, the external connection electrode 252 overlaps the via electrode 242.

The metal wiring layer 22 is formed on the first main surface 211 of the core substrate 21. The metal wiring layer 22 has a shape to cover the first main surface 211 of the core substrate 21 and has a predetermined thickness. The metal wiring layer 22 has a third main surface 221 opposed to a surface that is in contact with the first main surface 211. The metal wiring layer 22 includes an insulator and wiring electrodes 231, 232, 233, 234, 235, and 236. The insulator forming the metal wiring layer 22 is formed from an inorganic material that is a main material of a type similar to that of the core substrate 21.

The wiring electrode 231 and the wiring electrode 236 are planar electrode patterns formed in contact with the first main surface 211. A plurality of the wiring electrodes 232, 233, 234, and 235 are each realized by planar electrode patterns formed in a plurality of layers and inter-layer connection electrode patterns connecting the planar electrode patterns in different layers. The plurality of the wiring electrodes 232, 233, 234, and 235 each have an end surface exposed on the first main surface 211 and an end surface exposed on the third main surface 221. The wiring electrode 231 connects the circuit element SD1 to the via electrode 241. The wiring electrode 236 connects the circuit element SD4 to the via electrode 242. The end surface at the first main surface 211 side of the wiring electrode 232 is connected to the circuit element SD1. The end surface at the first main surface 211 side of the wiring electrode 233 is connected to the circuit element SD2. The end surface at the first main surface 211 side of the wiring electrode 234 is connected to the circuit element SD3. The end surface at the first main surface 211 side of the wiring electrode 235 is connected to the circuit element SD4. The wiring electrodes shown in FIG. 1 are examples, and other wiring electrodes may be formed in accordance with a circuit configuration to be realized in the radio-frequency module 10.

A plurality of land electrodes 261, 262, 263, 264, 265, and 266 are formed on the third main surface 221 of the metal wiring layer 22. The land electrode 262 is connected to the end surface at a side of the third main surface 221 (the third main surface 221 side) of the wiring electrode 232. The land electrode 263 is connected to the end surface at the third main surface 221 side of the wiring electrode 233. The land electrode 264 is connected to the end surface at the third main surface 221 side of the wiring electrode 234. The land electrode 265 is connected to the end surface at the third main surface 221 side of the wiring electrode 235.

The rewiring layer 30 is formed on the third main surface 221 of the metal wiring layer 22. The rewiring layer 30 has a shape to cover the third main surface 221 of the metal wiring layer 22, that is, the third main surface 221 side of the IC chip 20, and has a predetermined thickness. The rewiring layer 30 includes a resinous insulator and a plurality of rewiring electrodes 311, 312, 313, 314, 315, and 316. A plurality of land electrodes 321, 322, 323, 324, 325, and 326 are formed on an outer surface of the rewiring layer 30 that is opposed to a surface that is in contact with the third main surface 221.

The plurality of rewiring electrodes 311, 312, 313, 314, 315, and 316 are each realized by planar electrode patterns formed in a plurality of layers and inter-layer connection electrode patterns connecting the planar electrode patterns in different layers. The rewiring electrode 311 connects the land electrode 261 to the land electrode 321. The rewiring electrode 312 connects the land electrode 262 to the land electrode 322. The rewiring electrode 313 connects the land electrode 263 to the land electrode 323. The rewiring electrode 314 connects the land electrode 264 to the land electrode 324. The rewiring electrode 315 connects the land electrode 265 to the land electrode 325. The rewiring electrode 316 connects the land electrode 266 to the land electrode 326.

The mounted components 41, 42, and 43 are each an electronic component including mounting terminal electrodes on a bottom surface thereof or an electronic component including mounting terminal electrodes on a side surface thereof. In the example in FIG. 1, the mounted components 41 and 43 are each electronic component including mounting terminal electrodes on a bottom surface thereof, and the mounted component 42 is an electronic component including mounting terminal electrodes on a side surface thereof.

The mounted component 41 is mounted on the land electrode 321 and the land electrode 322 by soldering or the like. The mounted component 42 is mounted on the land electrode 323 and the land electrode 324 by soldering or the like. The mounted component 43 is mounted on the land electrode 325 and the land electrode 326 by soldering or the like.

With this configuration, the mounted components 41, 42, and 43 are mounted on the first main surface 211 of the IC chip 20. In a plan view, the mounted components 41, 42, and 43 overlap the IC chip 20. In addition, the mounted components 41, 42, and 43 are connected to the circuit elements SD1, SD2, SD3, and SD4 in predetermined circuit patterns by the electrode patterns in the rewiring layer 30 and the metal wiring layer 22. Furthermore, the mounted components 41, 42, and 43 and the circuit elements SD1, SD2, SD3, and SD4 are connected to the external connection electrodes 251 and 252 in predetermined circuit patterns via the via electrodes 241 and 242.

Accordingly, in the radio-frequency module 10, unlike the configuration of the related art, it is not necessary to mount the mounted components 41, 42, and 43 and the circuit elements SD1, SD2, SD3, and SD4 on a resin substrate formed separately from these components and elements. Therefore, the height of the radio-frequency module 10 is reduced.

Moreover, a region where the mounted components 41, 42, and 43 are arranged and a region where the circuit elements SD1, SD2, SD3, and SD4 are arranged overlap each other, and thus the planar area of the radio-frequency module 10 is also decreased.

Moreover, the mounted components 41, 42, and 43 and the circuit elements SD1, SD2, SD3, and SD4 are connected to each other only by the electrode patterns in the rewiring layer 30 and the metal wiring layer 22. The electrode patterns formed in the rewiring layer 30 and the metal wiring layer 22 of the IC chip 20 are less likely to generate parasitic components than an electrode pattern formed in a general substrate such as a printed circuit board. Because of this, it is possible to inhibit transmission loss, parasitic inductance, and parasitic capacitance therebetween. In addition, since certain circuit elements (the circuit elements SD1 and SD4 in FIG. 1) among the mounted components 41, 42, and 43 and the circuit elements SD1, SD2, SD3, and SD4 are respectively connected to the external connection electrodes 251 and 252 via only the via electrodes 241 and 242 penetrating in the IC chip 20, it is possible to inhibit transmission loss, parasitic inductance, and parasitic capacitance therebetween.

Therefore, with the configuration of the radio-frequency module 10, a low height and a small size can be realized, and transmission characteristics for radio-frequency signals and characteristics as a circuit function are also excellent.

It is possible to omit the rewiring layer 30. By omitting the rewiring layer 30, the height of the radio-frequency module 10 is further reduced, and transmission characteristics for radio-frequency signals and characteristics as a circuit function are also improved. On the other hand, by including the rewiring layer 30, it is possible to improve the flexibility in arrangement of the respective electrodes at the first main surface 211 side of the IC chip 20 and arrangement of the mounted components 41, 42, and 43.

The radio-frequency module 10 having such a configuration is produced, for example, by the following production process. First, the circuit elements SD1, SD2, SD3, and SD4 are formed on the core substrate 21 composed of a semiconductor substrate by applying a general semiconductor element formation process. Next, the metal wiring layer 22 is formed on the first main surface 211 of the core substrate 21. Next the rewiring layer 30 is formed on the third main surface 221 of the metal wiring layer 22. Next, the mounted components 41, 42, and 43 are mounted on the outer surface of the rewiring layer 30 by soldering or the like.

Figure 2:
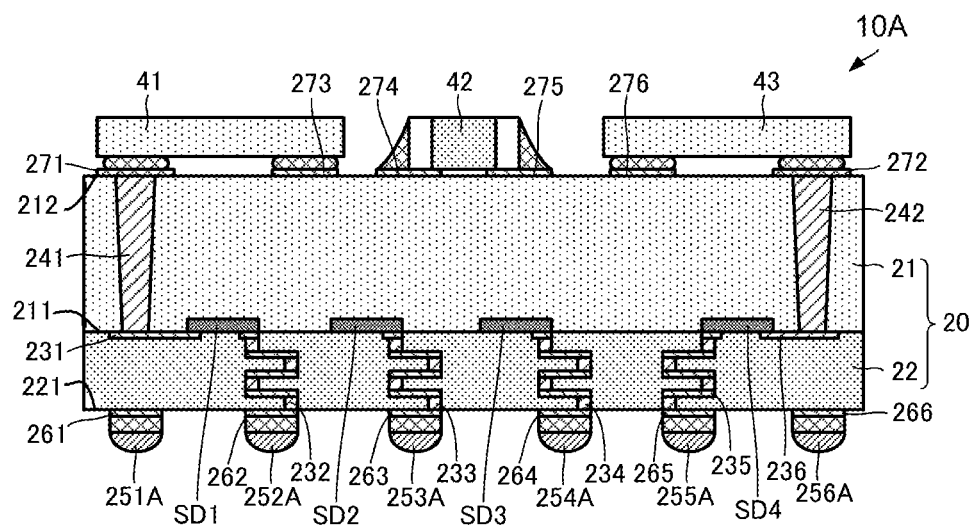
FIG. 2 is a side cross-sectional view showing the configuration of a radio-frequency module 10A according to a second embodiment of the present disclosure.

Next, a radio-frequency module according to a second embodiment will be described with reference to the drawing. FIG. 2 is a side cross-sectional view showing the configuration of the radio-frequency module according to the second embodiment of the present disclosure. In FIG. 2, the relationship between the vertical and horizontal dimensions is emphasized as appropriate, and does not necessarily coincide with the relationship between the actual vertical and horizontal dimensions. In FIG. 2, some electrodes are not shown.

As shown in FIG. 2, a radio-frequency module 10A according to the second embodiment is different from the radio-frequency module 10 according to the first embodiment in a structure for external connection and positions at which the mounted components 41, 42, and 43 are mounted on the IC chip 20. The basic configuration of the IC chip 20 in the radio-frequency module 10A is the same as that in the radio-frequency module 10, and the description of the same parts is omitted.

A plurality of land electrodes 271, 272, 273, 274, 275, and 276 are formed on the second main surface 212 of the core substrate 21 of the IC chip 20.

The mounted component 41 is mounted on the land electrode 271 and the land electrode 273. The mounted component 42 is mounted on the land electrode 274 and the land electrode 275. The mounted component 43 is mounted on the land electrode 272 and the land electrode 276.

The land electrode 271 is connected to the via electrode 241. Accordingly, the mounted component 41 and the circuit element SD1 are connected to each other. The land electrode 272 is connected to the via electrode 242. Accordingly, the mounted component 43 and the circuit element SD4 are connected to each other. The mounted component 42 is also connected to another circuit element via an electrode pattern that is not shown.

At the third main surface 221 of the metal wiring layer 22, a solder bump 251A for external connection is formed on the land electrode 261. A solder bump 252A for external connection is formed on the land electrode 262. A solder bump 253A for external connection is formed on the land electrode 263. A solder bump 254A for external connection is formed on the land electrode 264. A solder bump 255A for external connection is formed on the land electrode 265. A solder bump 256A for external connection is formed on the land electrode 266.

Owing to such a configuration, the radio-frequency module 10A is able to realize the same circuit configuration as the radio-frequency module 10. The radio-frequency module 10A has the same effects and advantages as the radio-frequency module 10.

Figure 3:
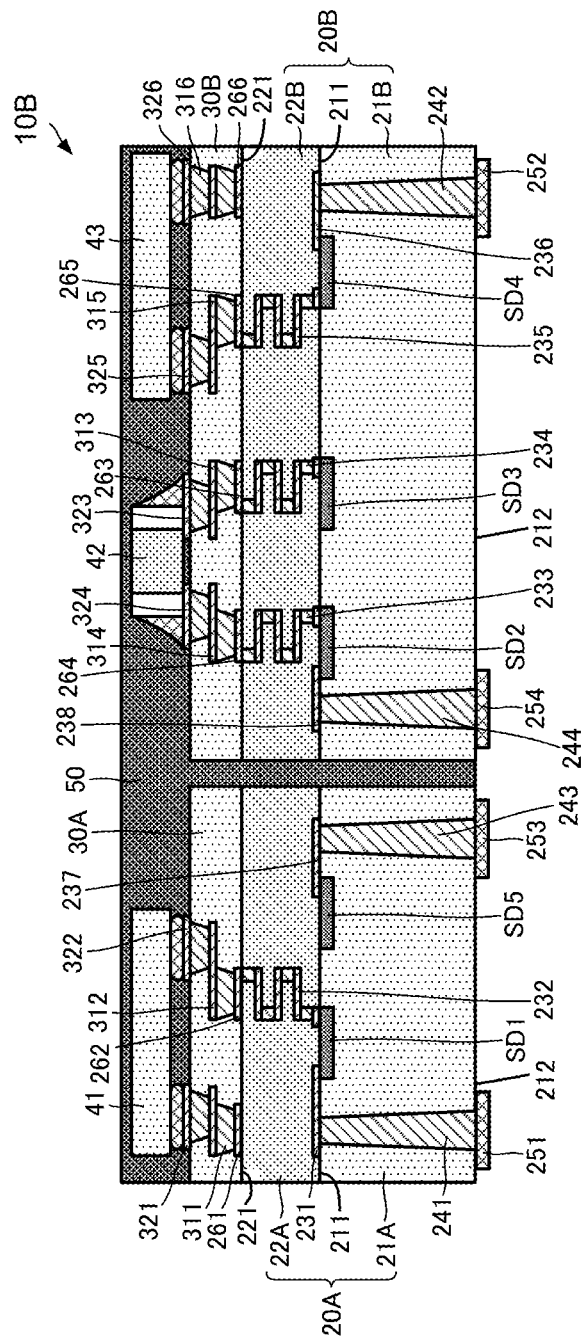
FIG. 3 is a side cross-sectional view showing the configuration of a radio-frequency module 10B according to a third embodiment of the present disclosure.

Next, a radio-frequency module according to a third embodiment of the present disclosure will be described with reference to the drawing. FIG. 3 is a side cross-sectional view showing the configuration of a radio-frequency module 10B according to the third embodiment of the present disclosure. In FIG. 3, the relationship between the vertical and horizontal dimensions is emphasized as appropriate, and does not necessarily coincide with the relationship between the actual vertical and horizontal dimensions. In FIG. 3, some electrodes are not shown.

As shown in FIG. 3, the radio-frequency module 10B according to the third embodiment is different from the radio-frequency module 10 according to the first embodiment in including a plurality of IC chips 20A and 20B. The basic configuration of the radio-frequency module 10B is the same as that of the radio-frequency module 10, and the description of the same parts is omitted.

The radio-frequency module 10B includes the IC chip 20A and the IC chip 20B. The IC chip 20A and the IC chip 20B are arranged adjacent to each other in a plan view. The second main surface 212 of the IC chip 20A and the second main surface 212 of the IC chip 20B are flush with each other.

A plurality of circuit elements SD1 and SD5 are formed on a core substrate 21A of the IC chip 20A. The mounted component 41 is mounted on the surface of a rewiring layer 30A at the first main surface 211 side of the IC chip 20A.

The core substrate 21A includes a plurality of via electrodes 241 and 243. An end portion at the second main surface 212 side of the via electrode 241 is connected to the external connection electrode 251 on the second main surface 212. An end portion at the first main surface 211 side of the via electrode 241 is connected to the circuit element SD1 via the wiring electrode 231 on the first main surface 211. An end portion at the second main surface 212 side of the via electrode 243 is connected to the external connection electrode 253 on the second main surface 212. An end portion at the first main surface 211 side of the via electrode 243 is connected to the circuit element SD5 via a wiring electrode 237 on the first main surface 211. In addition, the circuit element SD1 is connected to the mounted component 41 via the wiring electrode 232 in a metal wiring layer 22A, the land electrode 262, the rewiring electrode 312 in the rewiring layer 30A, and the land electrode 322.

A plurality of circuit elements SD2, SD3, and SD4 are formed on a core substrate 21B of the IC chip 20B. The mounted component 42 and 43 are mounted on the surface of a rewiring layer 30B at the first main surface 211 side of the IC chip 20B.

The core substrate 21B includes a plurality of via electrodes 242 and 244. An end portion at the second main surface 212 side of the via electrode 242 is connected to the external connection electrode 252 on the second main surface 212. An end portion at the first main surface 211 side of the via electrode 242 is connected to the circuit element SD4 via the wiring electrode 236 on the first main surface 211. An end portion at the second main surface 212 side of the via electrode 244 is connected to an external connection electrode 254 on the second main surface 212. An end portion at the first main surface 211 side of the via electrode 244 is connected to the circuit element SD2 via a wiring electrode 238 on the first main surface 211. In addition, the circuit element SD2 is connected to the mounted component 42 via the wiring electrode 233 in a metal wiring layer 22B, the land electrode 264, the rewiring electrode 314 in the rewiring layer 30B, and the land electrode 324. The circuit element SD3 is connected to the mounted component 42 via the wiring electrode 234 in the metal wiring layer 22B, the land electrode 263, the rewiring electrode 313 in the rewiring layer 30B, and the land electrode 323. The circuit element SD4 is connected to the mounted component 43 via the wiring electrode 235 in the metal wiring layer 22B, the land electrode 265, the rewiring electrode 315 in the rewiring layer 30B, and the land electrode 325.

Moreover, the radio-frequency module 10B includes a mold resin 50. The mold resin 50 is arranged so as to cover the outer surface side at the first main surface 211 side of the IC chip 20A and the IC chip 20B, that is, the surface side at which the plurality of mounted components 41, 42, and 43 are mounted, and so as to fill the gap between the IC chip 20A and the IC chip 20B. Accordingly, the IC chip 20A and the IC chip 20B are joined to each other, and the radio-frequency module 10B has a structure in which the IC chip 20A having the plurality of circuit elements SD1 and SD5 formed therein, the IC chip 20B having the plurality of circuit elements SD2, SD3, and SD4 formed therein, and the plurality of mounted components 41, 42, and 43 are integrated with each other.

Even with such a configuration, the same effects and advantages as those in the radio-frequency module 10 are obtained in the radio-frequency module 10B.

It is possible to apply the configuration of the radio-frequency module 10B to the radio-frequency module 10A. In addition, the thicknesses of the plurality of IC chips forming the radio-frequency module do not have to be same. Similarly, presence/absence of rewiring layers on the plurality of IC chips forming the radio-frequency module and the thicknesses of the rewiring layers do not have to be same.

Figure 4:
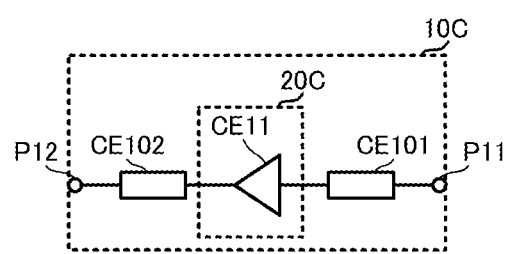
FIG. 4 is a circuit diagram showing a first application circuit example of a radio-frequency module 10C according to an embodiment of the present disclosure.

Next, circuit examples to which the radio-frequency modules having the above configurations are applied will be described with reference to the drawings. FIG. 4 is a circuit diagram showing a first application circuit example of a radio-frequency module 10C according to an embodiment of the present disclosure.

As shown in FIG. 4, the radio-frequency module 10C includes a plurality of external connection terminals P11 and P12, a power amplifier CE11, and a plurality of matching elements CE101 and CE102. The input terminal of the power amplifier CE11 is connected to the external connection terminal P11 via the matching element CE101. The output terminal of the power amplifier CE11 is connected to the external connection terminal P12 via the matching element CE102.

The power amplifier CE11 is realized by a circuit element formed within an IC chip 20C like the above-described circuit elements SD1, SD2, SD3, and SD4 in the IC chip 20. The plurality of matching elements CE101 and CE102 are realized by mounted components mounted on a first main surface of the IC chip 20C like the above-described mounted component 42. The plurality of external connection terminals P11 and P12 are formed on a second main surface of the IC chip 20C.

In such a configuration, the power amplifier CE11 is formed in the IC chip 20C, and thus it is possible to increase the heat dissipation of the power amplifier CE11. Accordingly, the radio-frequency module 10C including the power amplifier is able to achieve height reduction and excellent heat dissipation.

Figure 5:
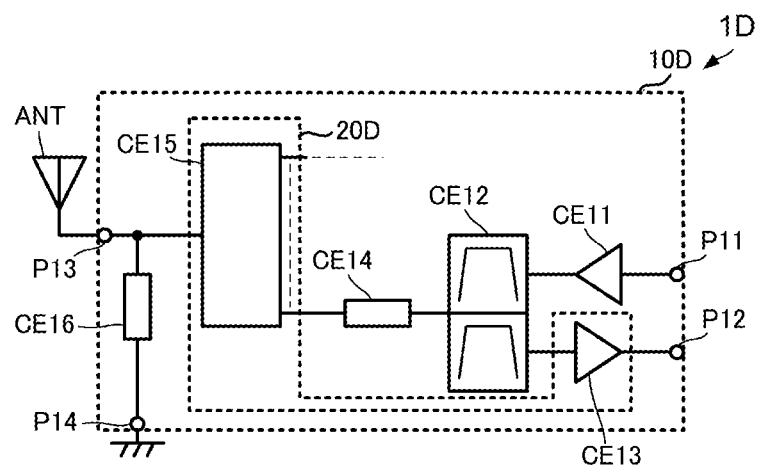
FIG. 5 is a circuit diagram showing a second application circuit example of a radio-frequency module 10D according to an embodiment of the present disclosure.

FIG. 5 is a circuit diagram showing a second application circuit example of a radio-frequency module 10D according to an embodiment of the present disclosure.

As shown in FIG. 5, the radio-frequency module 10D forms a part of a communication device 1D, that is, a front-end module for radio-frequency wireless communication. The communication device 1D includes the radio-frequency module 10D and an antenna ANT.

The radio-frequency module 10D includes a power amplifier CE11, a demultiplexer CE12, a low noise amplifier CE13, a matching element CE14, a demultiplexer CE15, an antenna matching element CE16, and a plurality of external connection terminals P11, P12, P13, and P14. The demultiplexer CE2 may be composed of, for example, two SAW (surface acoustic wave) filters or BAW (bulk acoustic wave) filters. In the case with SAW filters, each filter includes a substrate and IDT (interdigital transducer) electrodes. The substrate is a substrate having piezoelectricity on at least a surface thereof. The substrate may, for example, include a piezoelectric thin film on a surface thereof and be composed of a multilayer body such as a film having an acoustic velocity different from that of the piezoelectric thin film and a support substrate. In addition, the substrate may have piezoelectricity over the entire substrate. In this case, the substrate is a piezoelectric substrate composed of one piezoelectric layer. The demultiplexer CE15 may be a so-called switchplexer including such two switch elements, or may be another multiplexer having a demultiplexing function. The demultiplexer CE15 includes a plurality of terminals to be selected and a common terminal. The plurality of terminals to be selected are selectively connected to the common terminal.

The input terminal of the power amplifier CE11 is connected to the external connection terminal P11. The output terminal of the power amplifier CE11 is connected to one of the SAW filters of the demultiplexer CE12. The other SAW filter of the demultiplexer CE12 is connected to the input terminal of the low noise amplifier CE13. The output terminal of the low noise amplifier CE13 is connected to the external connection terminal P12.

The common terminals of the two SAW filters of the demultiplexer CE12 are connected to one of the plurality of terminals to be selected of the demultiplexer CE15 via the matching element CE14. The other terminals to be selected of the demultiplexer CE15 are connected to another transmission/reception circuit for radio-frequency signals that is not shown. The common terminal of the demultiplexer CE15 is connected to the external connection terminal P13, and the external connection terminal P13 is connected to the antenna ANT. In addition, the external connection terminal P13 is connected to the external connection terminal P14 via the antenna matching element CE16. The external connection terminal P14 is connected to ground (ground potential).

The low noise amplifier CE13 is realized by a circuit element formed within the IC chip 20 like the above-described circuit elements SD1, SD2, SD3, and SD4 in the IC chip 20. The power amplifier CE11, the demultiplexer CE12, the demultiplexer CE15, the matching element CE14, and the antenna matching element CE16 are realized by mounted components mounted on a first main surface of an IC chip 20D like the above-described mounted components 41, 42, and 43. The power amplifier CE11 may be realized by a circuit element formed within the IC chip 20D, and each demultiplexer may also be realized by a circuit element formed within the IC chip 20D if the demultiplexer is an LC filter. Similarly, other mounted components may also be realized by circuit elements formed within the IC chip 20D. The plurality of external connection terminals P11, P12, P13, and P14 are formed on a second main surface of the IC chip 20D.

Accordingly, the radio-frequency module 10D is able to achieve height reduction and size reduction. In this case, when circuit elements with heat generation such as the power amplifier CE11 and the low noise amplifier CE13 are formed as circuit elements within the IC chip 20D, the heat dissipation of these elements is improved.

Each of these application examples may also be realized using the configuration of the above-described radio-frequency module 10A or 10B.

Figure 6:
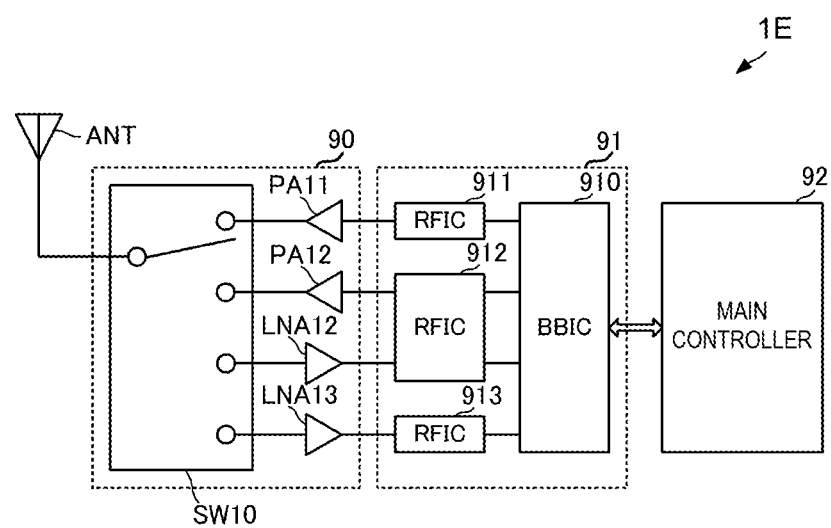
FIG. 6 is a functional block diagram of a communication device 1E according to an embodiment of the present disclosure.

The above-described radio-frequency modules are applicable to the following communication device. FIG. 6 is a functional block diagram of a communication device according to an embodiment of the present disclosure.

As shown in FIG. 6, a communication device 1E includes at least a radio-frequency module 90 and a communication IC 91, and further includes a main controller 92 and an antenna ANT.

The radio-frequency module 90 includes a switch circuit SW10, a power amplifier PA11, a power amplifier PA12, a low noise amplifier LNA12, and a low noise amplifier LNA13. The switch circuit SW10 includes a common terminal and a plurality of terminals to be selected, and selectively connects the plurality of terminals to be selected to the common terminal on the basis of a control signal.

The antenna ANT is connected to the common terminal. The power amplifier PA11, the power amplifier PA12, the low noise amplifier LNA12, and the low noise amplifier LNA13 are connected to the plurality of terminals to be selected, respectively. The communication IC 91 includes a BBIC 910, an RFIC 911, an RFIC 912, and an RFIC 913. That is, the BBIC 910, the RFIC 911, the RFIC 912, and the RFIC 913 are realized by circuit elements formed within an IC chip. The BBIC 910 is connected to the main controller 92 and executes various processing of a baseband signal according to control from the main controller 92. The RFIC 911, the RFIC 912, and the RFIC 913 are connected to the BBIC 910 and execute various processing of an RF signal.

The RFIC 911 is a transmission IC and is connected to the power amplifier PA11. The RFIC 912 is a transmission/reception IC and is connected to the power amplifier PA12 and the low noise amplifier LNA12. The RFIC 913 is a reception IC and is connected to the low noise amplifier LNA13.

The radio-frequency module 90 is realized by the configurations of the radio-frequency modules 10 to 10D shown in the respective embodiments described above. Furthermore, the configurations of the radio-frequency modules 10 to 10D shown in the respective embodiments described above are applicable to the radio-frequency module 90 and a module including the communication IC 91.

Accordingly, the communication device 1E inhibits transmission loss and is reduced in size. In addition, by using the RFICs or BBICs as circuit elements that can be formed within an IC chip, the heat dissipation effect of these ICs is improved.

1D, 1E communication device
10, 10A, 10B, 10C, 10D radio-frequency module
20, 20A, 20B, 20C, 20D IC chip
21, 21A, 21B core substrate
22, 22A, 22B metal wiring layer
30, 30A, 30B rewiring layer
41, 42, 43 mounted component
50 mold resin
90 radio-frequency module
91 communication IC
92 main controller
211 first main surface
212 second main surface
221 third main surface
231, 232, 233, 234, 235, 236, 237, 238 wiring electrode
241, 242, 243, 244 via electrode
251, 252, 253, 254 external connection electrode
251A, 252A, 253A, 254A, 255A, 256A solder bump
261, 262, 263, 264, 265, 266, 271, 272, 273, 274, 275, 276, 321, 322, 323, 324, 325, 326 land electrode
311, 312, 313, 314, 315, 316 rewiring electrode
ANT antenna
CE101, CE102 matching element
CE11 power amplifier
CE12 demultiplexer
CE13 low noise amplifier
CE14 matching element
CE15 demultiplexer
CE16 antenna matching element
P11, P12, P13, P14 external connection terminal
SD1, SD2, SD3, SD4, SD5 circuit element
910 BBIC
911, 912, 913 RFIC

The invention claimed is:

1. A radio-frequency module comprising:
an integrated circuit chip; and
a mounted component mounted on the integrated circuit chip,
wherein the integrated circuit chip comprises:
a core substrate composed of a semiconductor having a first main surface and a second main surface opposed to each other,
a metal wiring layer on the first main surface of the core substrate and having a contact surface in contact with the first main surface and a third main surface opposed to the contact surface,
a circuit element in the integrated circuit chip, and
a via electrode in the integrated circuit chip,
wherein the core substrate comprises an external connection electrode on the second main surface,
wherein the mounted component is mounted at a side of the third main surface, and
wherein the mounted component and the circuit element are connected to the external connection electrode by the via electrode in the integrated circuit chip.

2. The radio-frequency module according to claim 1, further comprising a rewiring layer on the third main surface,
wherein the metal wiring layer and the mounted component are connected to each other via the rewiring layer.

3. The radio-frequency module according to claim 2, further comprising a circuit element within the integrated circuit chip,
wherein the mounted component is connected to the circuit element via the metal wiring layer.

4. The radio-frequency module according to claim 2, wherein:
the radio-frequency module comprises a plurality of integrated circuit chips including the integrated circuit chip and a plurality of mounted components including the mounted component,
the plurality of integrated circuit chips are arranged adjacent to each other in a plan view, and
the plurality of mounted components are each mounted on any of the plurality of integrated circuit chips.

5. The radio-frequency module according to claim 1, wherein the mounted component is connected to the circuit element via the metal wiring layer.

6. The radio-frequency module according to claim 5, wherein:
the radio-frequency module comprises a plurality of integrated circuit chips including the integrated circuit chip and a plurality of mounted components including the mounted component,
the plurality of integrated circuit chips are arranged adjacent to each other in a plan view, and
the plurality of mounted components are each mounted on any of the plurality of integrated circuit chips.

7. The radio-frequency module according to claim 5, wherein a region where the mounted component is arranged and a region where the circuit element is arranged overlap each other in a plan view.

8. The radio-frequency module according to claim 7, wherein:
the core substrate includes an external connection electrode on the second main surface, and
the mounted component and the circuit element are connected to the external connection electrode by a via electrode provided in the integrated circuit chip.

9. The radio-frequency module according to claim 7, wherein:
the radio-frequency module comprises a plurality of integrated circuit chips including the integrated circuit chip and a plurality of mounted components including the mounted component,
the plurality of integrated circuit chips are arranged adjacent to each other in a plan view, and
the plurality of mounted components are each mounted on any of the plurality of integrated circuit chips.

10. The radio-frequency module according to claim 1, wherein:
the radio-frequency module comprises a plurality of integrated circuit chips including the integrated circuit chip and a plurality of mounted components including the mounted component, the plurality of integrated circuit chips are arranged adjacent to each other in a plan view, and the plurality of mounted components are each mounted on any of the plurality of integrated circuit chips.

11. The radio-frequency module according to claim 10, further comprising a mold resin covering surface sides of the plurality of integrated circuit chips where the mounted components are mounted and joining the plurality of integrated circuit chips.

12. The radio-frequency module according to claim 1, wherein:

the circuit element is a power amplifier, and the mounted component is a matching element connected to the power amplifier.

13. The radio-frequency module according to claim 1, wherein the circuit element is a low noise amplifier.

14. The radio-frequency module according to claim 1, wherein the circuit element is a switch element.

15. A communication device comprising:

the radio-frequency module according to claim 1; and a radio-frequency integrated circuit connected to the radio-frequency module, wherein the circuit element is the radio-frequency integrated circuit.

16. The communication device according to claim 15, further comprising a baseband integrated circuit connected to the radio-frequency integrated circuit, wherein the circuit element is the baseband integrated circuit.

17. A radio-frequency module comprising:

an integrated circuit chip; and first and second mounted components mounted on the integrated circuit chip, wherein the integrated circuit chip comprises:

a core substrate composed of a semiconductor substrate having a first main surface and a second main surface opposed to each other, a metal wiring layer on the first main surface of the core substrate and having a contact surface in contact with the first main surface and a third main surface opposed to the contact surface, and a circuit element within the integrated circuit chip, wherein, as seen in a plan view, the first and second mounted components are mounted adjacent to each other on the second main surface, and wherein, as seen in the plan view, the circuit element is arranged in a region between the first mounted component and the second mounted component.

18. The radio-frequency module according to claim 17, wherein the mounted component is connected to the circuit element via the metal wiring layer.

19. The radio-frequency module according to claim 17, wherein:

the radio-frequency module comprises a plurality of integrated circuit chips including the integrated circuit chip and a plurality of mounted components including the first and second mounted components, the plurality of integrated circuit chips are arranged adjacent to each other in a plan view, and the plurality of mounted components are each mounted on any of the plurality of integrated circuit chips.

* * * * *